United States Patent
Mudulodu

(10) Patent No.: US 11,632,140 B2
(45) Date of Patent: Apr. 18, 2023

(54) SYSTEM CLOCK SPUR REDUCTION IN OFDM RECEIVER

(71) Applicant: Silicon Laboratories Inc., Austin, TX (US)

(72) Inventor: Sriram Mudulodu, Hyderabad (IN)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 17/395,869

(22) Filed: Aug. 6, 2021

(65) Prior Publication Data

US 2023/0041647 A1 Feb. 9, 2023

(51) Int. Cl.
| | |
|---|---|
| *H04B 1/16* | (2006.01) |
| *H04L 5/00* | (2006.01) |
| *H03L 7/07* | (2006.01) |
| *G06F 1/08* | (2006.01) |
| *H04B 1/10* | (2006.01) |

(52) U.S. Cl.
CPC ............. *H04B 1/1607* (2013.01); *G06F 1/08* (2013.01); *H03L 7/07* (2013.01); *H04B 1/1036* (2013.01); *H04L 5/0007* (2013.01)

(58) Field of Classification Search
CPC ....... H04B 1/1607; H04B 1/1036; G06F 1/08; H03L 7/07; H04L 5/0007
See application file for complete search history.

(56) References Cited

U.S. PATENT DOCUMENTS

| | | | | |
|---|---|---|---|---|
| 6,009,073 A | * | 12/1999 | Kaneko | ............. H04L 27/26524 370/480 |
| 7,688,927 B2 | * | 3/2010 | Fraasch | ................ H03D 13/004 375/371 |
| 2008/0025379 A1 | * | 1/2008 | Hayem | ..................... G06F 1/08 375/216 |

* cited by examiner

*Primary Examiner* — Janice N Tieu

(74) *Attorney, Agent, or Firm* — File-EE-Patents.com; Jay A. Chesavage

(57) ABSTRACT

A receiver for OFDM subcarriers has a first mode and a second mode. In the first mode, a tunable system clock is output at a nominal frequency, and in the second mode, the tunable system clock is offset so that a harmonic of the tunable system clock coincides with a particular OFDM subcarrier. The tunable system clock is coupled to a programmable modem PLL clock generator which generates clocks for an A/D converter coupled to a baseband processor which is also coupled to the programmable modem PLL clock generator. The programmable modem PLL clock generator is programmed to maintain a constant output frequency of each output in the first mode and the second mode.

21 Claims, 3 Drawing Sheets

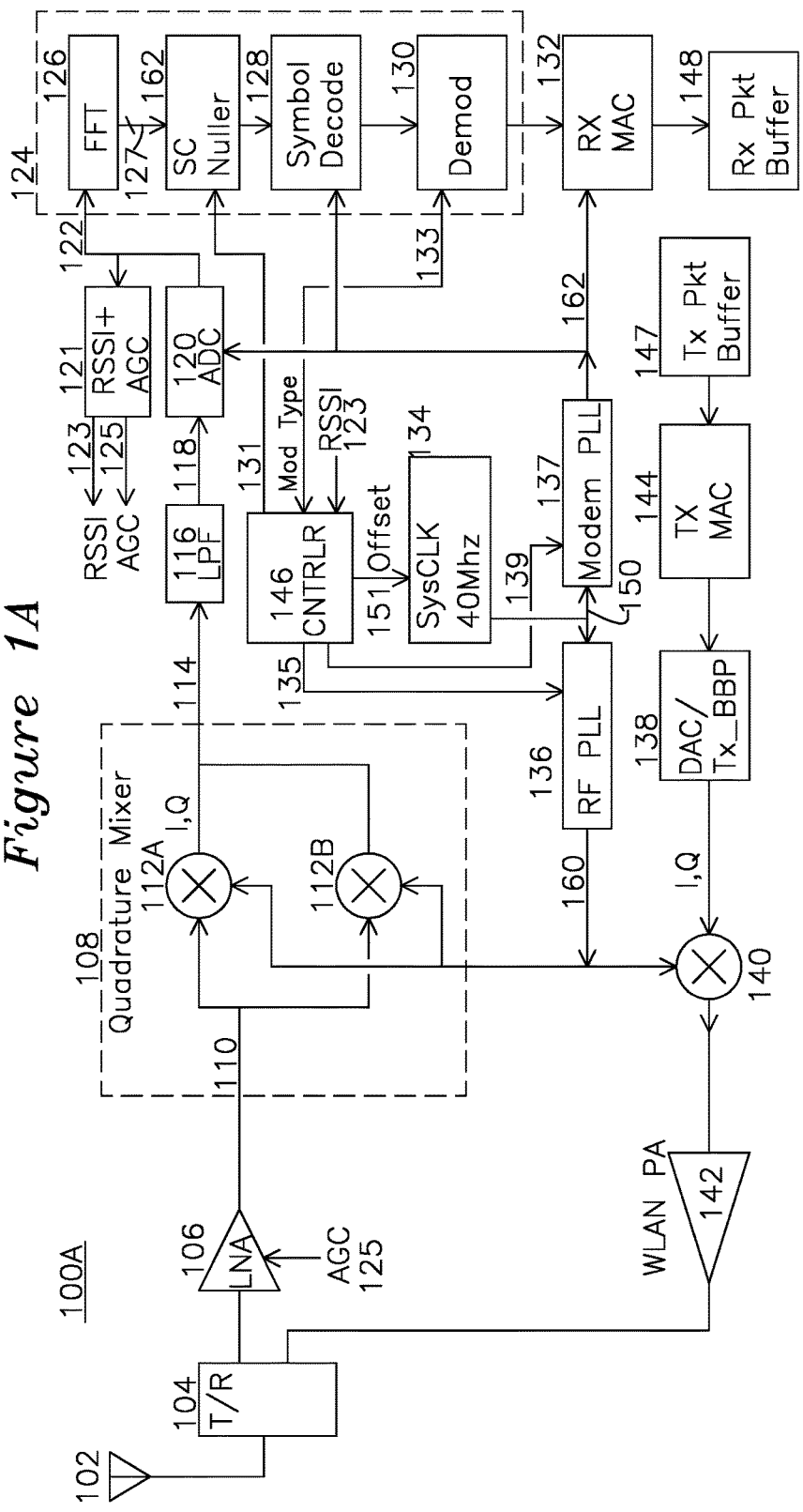
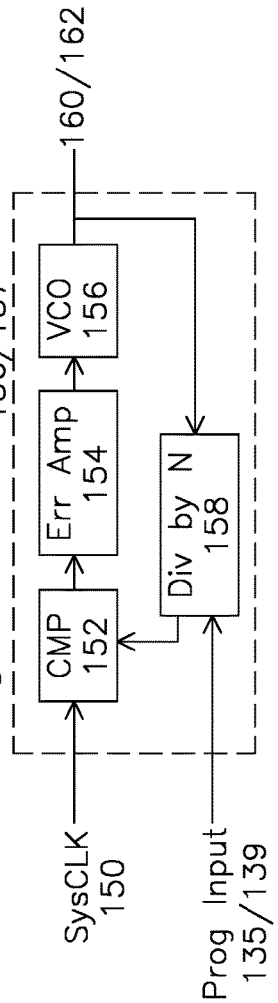
*Figure 1A*
*Figure 1B*

FFT Output with SC nulled

FFT Nuller

Controller

SYSTEM CLOCK SPUR REDUCTION IN OFDM RECEIVER

FIELD OF THE INVENTION

The present invention relates to reduction of detrimental effects of harmonics of a clock in a receiver system. In particular, the invention improves demodulation accuracy in an Orthogonal Frequency Division Multiplexed (OFDM) receiver by adaptively changing a system clock frequency or nulling FFT subcarriers corresponding to harmonics of the system clock.

BACKGROUND OF THE INVENTION

A receiver for Orthogonal Frequency Division Multiplexed (OFDM) WLAN symbols has a system clock coupled to at least one PLL frequency multiplier for performing signal processing of the incoming symbol stream which is mixed to baseband from a 2.4 Ghz radio frequency (RF) packet transmission. An example OFDM system may operate in communication channels of 20 MHz bandwidth, each communication channel having 16.6 MHz of occupied bandwidth (OBW) accommodating 52 subcarriers with 312.5 Khz of subcarrier center-center frequency spacing. In an example 802.11a OFDM communications system, the 52 subcarriers comprise 48 data subcarriers, 4 pilot subcarriers modulated using BPSK modulation, and 1 null carrier at a 0th subcarrier at the center of the subcarriers. In one example, the subcarriers are numbered with an index from −26 to +26 with an index 0 being the null subcarrier.

A problem arises in that a harmonic of the system clock may present and interfere with an occupied subcarrier of the OFDM symbols. For example, for channel 6 (with 0th subcarrier at 2437 MHz), the 9th subcarrier is at 2437 MHz+9*0.3125 MHz=2439.8125 MHz, and the 10th subcarrier is at 2437 MHz+10*0.3125 MHz=2440.125 MHz. The 61st harmonic of 40 MHz is at 2440 MHz, on the low end of the 10th subcarrier. This harmonic of the system clock may degrade the performance of the system by superimposing the harmonic with the OFDM subcarrier, thereby introducing an uncertainty in the demodulation of the 10th subcarrier by introduction of phase noise and interference.

It is desired to reduce the influence of the system clock harmonics on the demodulation of the received subcarriers.

OBJECTS OF THE INVENTION

A first object of the invention is an apparatus for reducing errors in an OFDM receiver caused by receiver system clock harmonics mixing with a particular received subcarrier and blurring a constellation symbol for the particular received subcarrier and possibly adjacent subcarriers, the apparatus comprising a tunable system clock such as a tunable crystal oscillator coupled to a programmable RF PLL and a programmable modem PLL, the programmable RF PLL coupled to RF transmit and RF receive mixers, and the programmable modem PLL coupled to a baseband processor receiving OFDM symbols, the apparatus having a threshold detector for high datarate OFDM signals with weak signal strength, the threshold detector operative in a first mode to apply no frequency offset when the threshold is not exceeded, the threshold detector operative in a second mode when the threshold is exceeded to apply a frequency offset to the tunable system clock frequency to place a harmonic of the tunable system clock frequency to coincide with a center frequency of a particular received subcarrier for a duration of packets, the programmable RF PLL and programmable modem PLL maintaining a respective same output frequency during the first mode and the second mode, the apparatus also nulling or attenuating the particular received subcarrier at an output of an FFT processor of the baseband processor.

A second object of the invention is an apparatus for reducing errors in an OFDM communication system operating below a threshold determined by incoming signal strength and modulation rate, the apparatus comprising a tunable system clock having a frequency offset input set to a nominal frequency in a first mode, the tunable system clock coupled to a programmable modem PLL clocking a baseband signal processor with a Fast Fourier Transform (FFT) processor having a plurality of outputs, the apparatus using a combination of datarate and signal strength to determine the threshold, the apparatus identifying a harmonic of the tunable system clock corresponding to a particular subcarrier of an OFDM signal being received, and when the SNR for a modulation rate is below a threshold, operating in a second mode by applying a frequency offset to the tunable system clock to place the harmonic of the tunable system clock at the particular subcarrier frequency, and also changing the programmable modem PLL to maintain an output frequency associated with the nominal frequency of the tunable system clock and also nulling an output of the FFT corresponding to the particular subcarrier.

SUMMARY OF THE INVENTION

In one example of the invention, a tunable crystal oscillator receiving a frequency offset input is used to generate a tunable system clock for distribution through a communications system. The tunable system clock receives a frequency offset input to slightly vary the frequency of the tunable system clock output, which is coupled to a programmable modem PLL and a programmable RF PLL, which are the respective clock sources for a baseband processor and RF front end. The tunable system clock output may drive other subsystems as well.

A wireless communications receiver for wireless packets modulated with OFDM subcarriers in a communication channel processes the packets by amplifying the received RF, converting the RF to a quadrature baseband signal stream, digitizing the signal stream into a sampled symbol stream, which is done by an analog to digital converter (ADC) clocked by a clock generated by the programmable modem PLL driven by the tunable system clock (which may rely on a crystal oscillator or XO clock). In a first mode of operation, the tunable system clock outputs a nominal output frequency such as 40 MHz when the frequency offset input set to zero, and the programmable modem PLL outputs a nominal modem PLL frequency associated with a multiple of the system clock nominal output frequency. In a second mode of operation, the tunable system clock frequency is changed by application of the frequency offset input to non-zero value, causing a change in the system clock frequency which places a harmonic of the tunable system clock to coincide with a particular received subcarrier frequency, and the programmable modem PLL is programmed to generates a modem PLL frequency which is the same value as the nominal modem PLL frequency.

Although the tunable system clock may change frequency to place a harmonic at the same frequency of a closest OFDM subcarrier, the ADC and baseband processor operate using clocks with unchanged frequency which are generated by the programmable modem PLL. The programming input of the programmable modem PLL is changed to provide the same frequency for the first mode and the second mode by adjustment of the programming parameters, and where the tunable system clock has a nominal frequency with no offset frequency in the first mode and an offset frequency which places a harmonic of the tunable system clock at a center frequency of a particular subcarrier of an OFDM symbol in the second mode. The second mode is preferably selected based on a threshold which is determined from the Signal to Noise Ratio (SNR) and modulation rate, such as a threshold of 6 dB for BPSK, 12 dB for QPSK, 18 dB for QAM-16, 24 dB for QAM-64, and 30 dB for QAM-256. When the OFDM receiver operates in the second mode with a harmonic of the tunable system clock at a center frequency of the particular subcarrier, the Fast Fourier Transform (FFT) output associated with the particular subcarrier of the tunable system clock harmonic is nulled (blanked off to produce no output) or the associated FFT output is attenuated. The other outputs of the FFT are used to generate data according to a constellation map for each subcarrier, the constellation map selected according to the modulation rate, and the outputs of the FFT processor with nulled subcarrier are corrected to an estimate of the transmitted symbol using standard demodulation methods which have robustness for single subcarrier errors. This approach represents an improvement over having multiple subcarrier errors that would ordinarily occur in the first mode of operation with the system clock spur falling between OFDM subcarriers. Typical constellation maps include QAM-16 (the constellation map comprising a 4×4 grid of available subcarrier phase/amplitudes), QAM-64 (8×8 grid), or QAM-256 (16×16 grid). The increasingly higher data rates and associated constellation maps require greater precision in locating a subcarrier in a particular grid location of the constellation map for accurate symbol decoding. The output of the resolution of symbols to points on the constellation map is subsequently decoded into a data stream by the baseband processor, which outputs the data stream to a Media Access Controller (MAC), which recovers and concatenates the packet data for storage into a packet memory.

The tunable system clock may generate harmonics which interfere with the correct de-mapping of the OFDM subcarriers, particularly when the received signal level is low, or the modulation rate is high with higher constellation densities in use. A particular relationship between signal level and data rate may be formed which indicates when additional signal processing methods should be used.

In a first example of the invention, the tunable system clock is generated by a crystal oscillator with a frequency offset input such that the tunable system clock can be tuned to place a harmonic (known as a spur) at the center of a particular subcarrier rather than adjacent to the subcarrier or between two adjacent subcarriers. It is believed that the placement of a spur due the harmonics of the tunable system clock directly at the center of a particular subcarrier rather than adjacent to it reduces the phase rotation of the superimposed spur and particular subcarrier, thereby reducing errors caused by the superposition of the spur and particular subcarrier, particularly for a weak RSSI and a comparatively stronger spur, while also preventing the spur from interfering with adjacent subcarriers. The tuning of the tunable system clock or crystal clock is done such that harmonic spur overlaps exactly to the center frequency of a particular subcarrier frequency may be done adaptively and according to a threshold based on signal to noise ratio (SNR) and modulation type, where the threshold varies, depending on a particular combination of data rate, or modulation type, and received signal strength, or SNR.

The changes in the clock frequencies of the modem PLL clock output which is derived using the tunable system clock due to the change in the system clock frequency are restored to their original frequencies by updating the modem PLL configuration to maintain the original modem PLL clock frequency used during the first mode of operation.

In a second example of the invention, a particular output of the FFT corresponding to the particular subcarrier is mixed with the spur of the tunable system clock, the FFT nulls (zeros or blanks) the corresponding subcarrier output of the FFT. There is sufficient redundancy in the 56 subcarriers used to form individual symbols that the zeroing of a single subcarrier generates fewer errors than where a particular symbol which has no subcarrier energy present at a particular constellation point receives spur energy in place of the subcarrier which is not present, or mixing of spur energy with a subcarrier into an incorrect constellation map point. In an example of the invention, the particular subcarrier nulling of a subcarrier associated with the tunable system clock spur utilizes a threshold which is dependent on the data rate and modulation associated with the constellation mapping, and the nulling of a particular FFT output utilizes this pre-determined threshold. In a first example of the invention, the particular subcarrier or subcarriers associated with the tunable system clock spur are nulled. In another example of the invention, the sub-carriers associated with the tunable system clock spur are provided a lower weight compared to the sub-carriers not affected by the spur. In this embodiment, a lower weight indicates a value less than 1 and greater than 0 compared to other FFT outputs which receive a weight of 1. The complete nulling of the spur affected sub-carriers indicates that the provided weight is zero.

BRIEF DESCRIPTION OF THE DRAWINGS

FIG. 1A is a block diagram of a Radio Frequency (RF) receiver, baseband processor, and MAC according to an example of the invention using a tunable system clock and programmable PLLs.

FIG. 1B is a block diagram of an example programmable RF or modem PLL.

DETAILED DESCRIPTION OF THE INVENTION

Figure 2A:
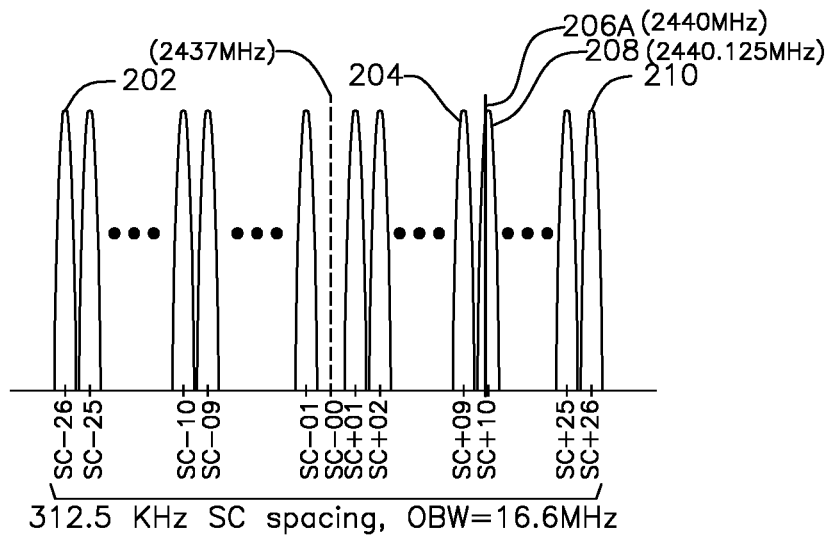
FIG. 2A is a plot of OFDM subcarriers with a tunable system clock spur in a first mode.

FIG. 1A shows a block diagram 100A of a system according to a first example of the invention. Wireless signals coupled to antenna 102 pass through transmit/receive switch 104 to low noise amplifier 106 providing amplification and gain control via AGC input 125. Quadrature mixer 108 has in-phase (I) 112A and quadrature (Q) 112B mixers providing I and Q outputs 114 to matched low pass filters 116 and dual Analog to Digital converters 120, which provides the I and Q signal streams 122 to baseband processor 124, as well as to RSSI and AGC processor 121 which generates an AGC signal 125 applied to LNA 106 during a preamble interval, and RSSI 123 which indicates the receive signal strength. The RSSI and modulation type 133 may be used by the controller 146 to select between the first mode and the second mode. Tunable system clock 134 is connected to programmable RF PLL 136 and programmable modem PLL 137, which both use the tunable system clock 150 as an input reference to generate the associated RF clock 160 and modem clocks 162. In an example of the invention, the tunable system clock comprises a crystal oscillator (XO) with a series or parallel capacitor that changes capacitance with an offset voltage 150 input that causes the XO frequency to shift to increased or decreased frequency in response to the offset voltage 150 input.

A block diagram for an example programmable RF PLL 136 or Modem PLL 137 is shown in FIG. 1B. The tunable system clock 150 is applied to frequency or phase comparator 152, which compares VCO 156 output and generates an error signal which is amplified and filtered 154 and applied as an input to VCO 156. The respective programmable input 135/139 modifies N of the divide by N 158, which may be an integer or M/N fractional value to achieve the required tens of ppm changes in frequency.

In a first example of the invention, the controller 146 first mode is operative where the threshold is above an SNR of 6 dB for BPSK modulation, SNR of 12 dB for QPSK modulation, SNR of 18 dB for QAM-16 modulation, SNR of 24 dB for QAM-64 modulation, and SNR of 30 dB for QAM-256 modulation, and the second mode is operative when the SNR is below the given SNR threshold for each associated modulation type. In second example of the invention, the threshold for the first mode is when the SNR exceeds 12 dB for BPSK modulation, 18 dB for QPSK modulation, 24 dB for QAM-16 modulation, 30 dB for QAM-64 modulation, and 36 dB for QAM-256 modulation, and the second mode is operative when the SNR is below the given SNR threshold for each modulation type. In a third example of the invention, a hysteresis of 6 dB is used for a given modulation type, such that the second mode is enabled when the SNR drops below the threshold for the first example of the threshold and associated modulation (i.e. 6 dB for BPSK modulation), and the first mode is enabled with the SNR rises 6 dB above the same threshold for that modulation type (i.e. 12 dB). Other thresholds may be used, these are given only as examples for understanding the invention.

In a first mode, the tunable system clock 134 operates at a nominal frequency with a zero frequency offset 151, and in a second mode, the tunable system clock 134 is provided with a non-zero frequency offset 151 to tune the tunable system clock 134 to a nearby particular frequency in a range such as +/−100 ppm from the nominal system clock frequency of the first mode, where the particular frequency in the second mode is selected to place a harmonic of the tunable system clock 150 to a center frequency of an adjacent OFDM subcarrier of the first mode. When the tunable system clock 134 is set to the second mode, the RF PLL 136 and Modem PLL 137 also have respective adjusted programmable input values 135 and 139 which cause the respective outputs 160 and 162 to have the same respective output frequencies as in the first mode, even though the tunable system clock 150 is now set to a different non-zero offset 151 frequency 150 in the second mode compared to the first mode. For example, in a first mode of operation, the tunable system clock frequency 150 may be 40 MHz and the frequency of the RF PLL 160 is 2437 MHz (of FIG. 2A), the Modem PLL generates 80 MHz to the baseband processor 124 and 40 MHz to the ADC 120. In the first mode of operation, the 61st harmonic of the 40 MHz tunable system clock 150 is 2440 MHz, whereas an OFDM subcarrier may be centered at 2440.125 MHz as shown in FIG. 2A. In the second mode of operation, to place the 61st harmonic of the 40 MHz tunable system clock at 2440.125 MHz, the 40 MHz tunable system clock 134 is tuned to place the 61st harmonic at 2440.125 MHz, so the tunable master clock is set at 40.002049 MHz, or 51 ppm (parts per million) above nominal frequency using frequency offset input 151, and the RF PLL 136 and modem PLL 137 are both programmed such that the RF PLL continues to output 2437 MHz, and the modem PLL outputs 80.000 MHz to baseband processor 124 and 40.000 MHz to the ADC 120, as before, and compensating for the change in tunable system clock frequency which drives the RF and modem PLL clock generators. The operation of the tunable system clock frequency offset input 151 and the programmable inputs 135 and 139 to the RF PLL 136 and modem PLL 137, respectively, ensures that the tunable system clock 150 harmonic may be set to a center frequency of an adjacent OFDM subcarrier, while the RF PLL clock output 160 and modem PLL clock output 162 remain unchanged between first mode and second mode of operation.

ADC samples 122 are provided to Fast Fourier Transform (FFT) processor 126 of baseband processor 124. FFT processor 126 has as many outputs as occupied subcarriers used in the communication system, or the closest power of two greater number, such as 64 output channels 127 delivered to symbol decoder 128, which maps the subcarrier amplitudes and phases into a constellation grid for performing demodulation 130 into a data stream suitable for arrangement into a Media Access Controller (MAC) 132 which transfers data to data buffer 148. Transmit operations include the TX MAC 144 taking data from the packet buffer 147, processing with a transmit baseband processor and digital to analog converter (DAC) 138, quadrature mixing 140 with a transmit clock from RF PLL 136, which is amplified 142, and coupled through the T/R switch 104 to antenna 102. As was described earlier, tunable system clock generator 134 output is used by the modem PLL 137 to generate a master clock such as 40 MHz used by the ADC 120, baseband processor 124, and Receive MAC 132.

The problem of harmonic spurs of the system clock interfering with subcarriers worsens when receiving low level RF with discrete subcarriers such as OFDM which interfere with one or more occupied or unoccupied OFDM subcarriers. When this occurs, one of the FFT 126 outputs may present the system clock harmonic or spur energy when no subcarrier for that FFT output is present in a particular symbol, or at a different time when a subcarrier near the same frequency as the spur is present, such that the spur and particular subcarrier may superimpose, causing the FFT output to generate a spurious subcarrier or a subcarrier with an unwanted phase rotation or amplitude error, resulting in the particular subcarrier contribution to the constellation map to lose accuracy and information value, since each position of the QAM mapping in the constellation provides multiple bits of data (4 bits for each point of a QAM-16, 6 bits for each point of QAM-64, and 8 bits for each point of QAM-256). Further, the influence of the spur on successful decoding depends on its relative strength compared to the subcarrier and modulation method, since the margin for amplitude error in QAM-256 is much smaller than for QAM-16. Controller 146 starts in the first mode of operation with nominal tunable system clock frequency 150 and no frequency offset 151, and examines the received signal strength indication (RSSI) 123 and modulation type 131 and determines whether to assert a frequency correction to the tunable system clock generator 134 as well as the amount of frequency correction from known characteristics of the tunable system clock 134 and the subcarrier center frequencies. In the previously described second mode of the invention, the tunable system clock 134 is modified by a few tens of ppm such that the spur frequency is offset to the center of a nearest OFDM subcarrier frequency, while the programming for the RF PLL and modem PLL is changed to compensate, so the RF PLL and modem PLL maintain the same output frequency in first or second mode.

Figure 2B:
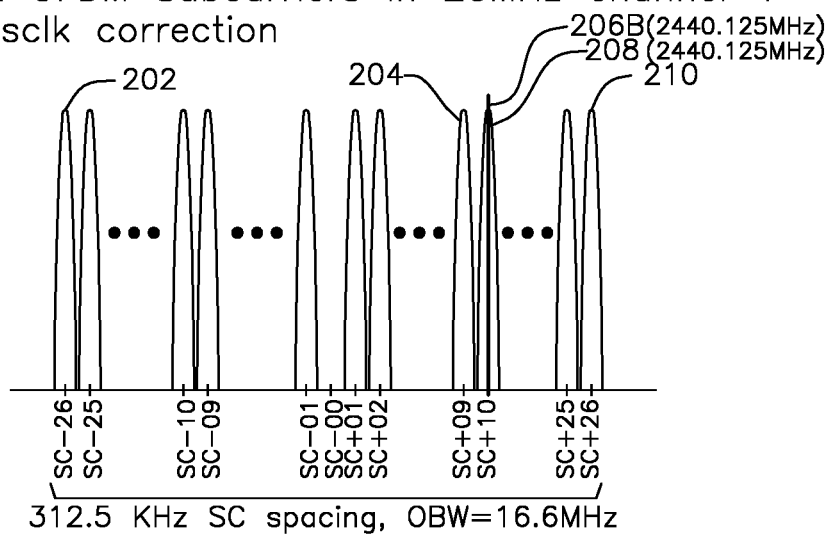
FIG. 2B is a plot of OFDM subcarriers using the system of FIG. 1A in a second mode.
Figure 2C:
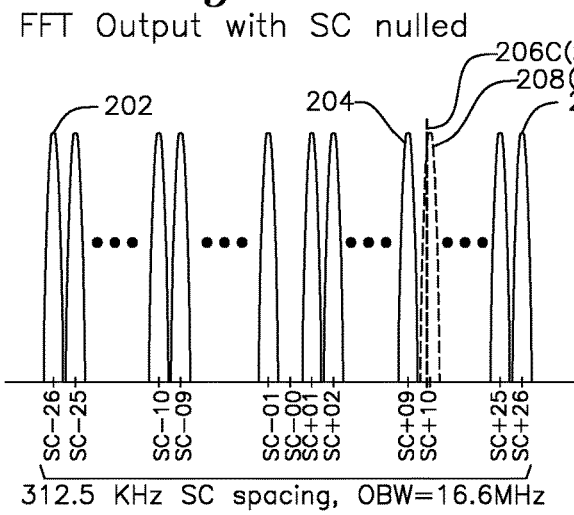
FIG. 2C is a plot of OFDM subcarriers using the system of FIG. 1A with particular subcarrier nulling.

FIG. 2A shows an example of this for the 2.4 Ghz band channel 6 with a channel center frequency of 2437 MHz. The subcarriers are numbered with respect to the center (null) subcarrier at SC+0 with no subcarrier energy present at the center (null) subcarrier. The SC+10 (10th subcarrier of channel 6) center frequency is 2440.125 MHz (2437 MHz+ 10*312.5 Khz), whereas the 61st harmonic of the 40 MHz tunable system clock is 2440.000 MHz, which is offset from SC+10 subcarrier by 125 Khz and will cause phase rotation of the SC+10 subcarrier in the constellation map, resulting in an error. As shown in the plot of FIG. 2A, the spur 206A has comparable amplitude to the 10th subcarrier 208. In this example, the controller 146 operating in the second mode outputs an offset 151 frequency 150 corresponding to 125 KHz to the tunable system clock generator 134, which then provides offset 150 sufficient for the tunable system clock to output 40.002049 MHz instead of 40.000000 MHz, thereby shifting the tunable system clock 41st harmonic spur located in the first mode at frequency 2440 MHz to 2440.125 MHz of the second mode. The offset in the tunable system clock frequency is calculated as $\{(f_{spur}-f_{subcarrier})/(f_c/f_{sysclk})\}$. For example, if fc=2440 MHz then the tunable system clock offset for 40 MHz would be 2049.18 Hz. Nulling of the particular subcarrier corresponding to the spur set to the center frequency of the particular subcarrier is beneficial in circumstances where sub-carrier nulling results in performance improvement, which may be determined by a differential error measurement between nulling the particular subcarrier, giving the particular subcarrier a reduced weight at the FFT output, or taking no action on the particular subcarrier at the output of the FFT. In an example embodiment in the second mode, based on MCS (modulation scheme and coding of IEEE 802.11 standard) and RSSI, both tunable system clock offset to place the spur on a particular subcarrier and particular sub-carrier nulling methods are applied. FIG. 2B shows the new relationship between subcarrier 208 and spur 206B which has moved slightly in frequency in response to the frequency offset input of the second mode to be co-incident with the center frequency of subcarrier 208 at 2440.125 MHz, and FIG. 2C shows the blanking of SC+10 208.

Figure 3:
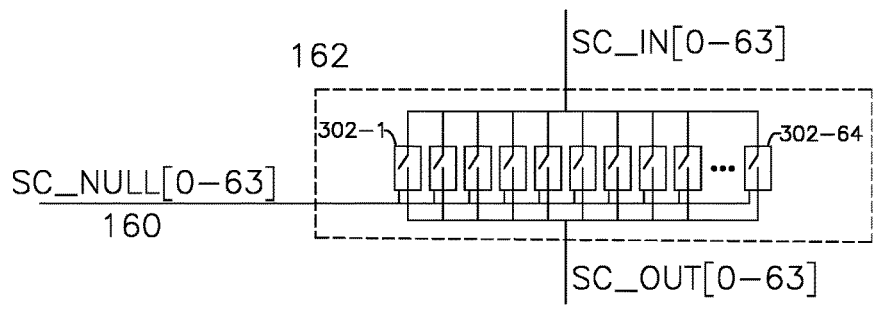
FIG. 3 is a block diagram for a FFT nuller 162 for the system of FIG. 1A.

FIG. 3 shows an example FFT nuller 162, comprising a plurality of pass-through switches 302-1 through 302-64 (for 64 subcarriers), typically one for each occupied subcarrier and associated FFT output of the particular communication system. Each switch is individually controlled by SC NULL [0-63] 160 such that individual subcarriers may be nulled by opening an associated switch, where typically only one subcarrier associated with the spur is removed. In an alternate example of the invention, the selected particular subcarrier has a reduced weight compared to other subcarriers. In an embodiment, more than one subcarrier may be assigned a reduced weight or nulled.

Figure 4:
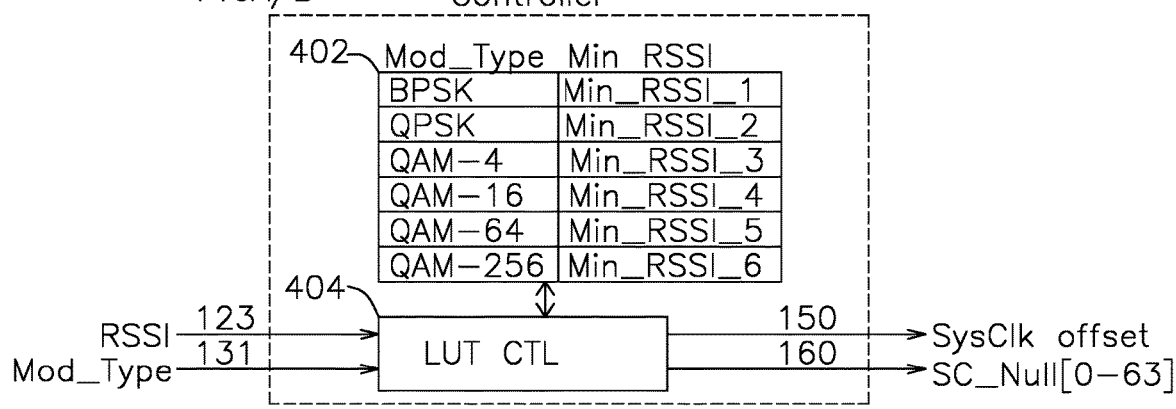
FIG. 4 is a block diagram for a controller 146 for use in the system of FIG. 1A.

FIG. 4 shows a controller 146 which inputs RSSI 123 and the modulation type 131, and uses a method such as a lookup table 402 which associates a modulation type with a minimum RSSI required to support the modulation type to establish the threshold for selection between first mode and second mode of operation. When the RSSI 123 is less than the Min RSSI associated with a particular modulation type, either the first method of shifting the tunable system clock 134 using output 150, or the second method of nulling 162 the interfering subcarrier with asserted SC NULL 160 is performed. Shifting or offsetting the tunable system clock 134 and nulling the output of the FFT are typically performed together, but may be performed separately, for example, only providing a frequency offset to place the spur at a particular OFDM subcarrier that is nearest, or alternatively, providing a frequency offset to an unoccupied or unused subcarrier, for which the particular FFT processor output corresponding to the particular spur may be ignored by the baseband processor without explicit nulling at the output of the FFT processor. Typically, higher density modulation methods such as QAM-256 require a greater minimum RSSI for operation without using the first or second corrective techniques.

The present examples are provided for illustrative purposes only, and are not intended to limit the invention to only the embodiments shown.

I claim:

1. An Orthogonal Frequency Division Multiplexing (OFDM) receiver comprising:
   an Radio Frequency (RF) amplifier receiving wireless packets;
   a tunable system clock generator having a frequency offset input for varying a system clock frequency;
   a programmable modem Phase Locked Loop (PLL) clock coupled to the tunable system clock generator and operative to change an output frequency based on a programmable input;
   a baseband converter generating a stream of digitized baseband quadrature symbols and using a clock derived from the programmable modem PLL clock;
   a baseband processor having a Fast Fourier Transform (FFT) processor coupled to the digitized baseband quadrature symbols and generating a plurality of outputs, each output of the plurality of outputs corresponding to an OFDM subcarrier, the baseband processor using a clock derived from the programmable modem PLL clock;
   the tunable system clock generator having at least one harmonic frequency interfering with a particular OFDM subcarrier frequency;
   a controller detecting a receive signal strength or signal to noise ratio (SNR) and modulation type, the controller asserting a first mode when the receive signal strength and the modulation type are above a threshold and asserting a second mode when the receive signal strength and the modulation type are below a threshold;
   the tunable system clock generator configured to generate a system clock output harmonic frequency of a nearest OFDM subcarrier in the second mode;
   the controller programming the programmable modem PLL to maintain a same modem PLL output frequency in the first mode as in the second mode.

2. The OFDM receiver of claim 1 where the FFT processor output is weighted according to the first mode or the second mode, where the FFT processor output weights include a 0 weight for the particular subcarrier when the second mode is active and a 1 weight for the particular OFDM subcarrier when the first mode is active.

3. The OFDM receiver of claim 1 where the FFT processor output is weighted according to the first mode or the second mode, where the FFT processor output weights include a weight from 0 to 0.5 for the particular subcarrier when the second mode is active and a 1 weight for the particular subcarrier when the first mode is active.

4. The OFDM receiver of claim 1 where the threshold is at least one of:
   the SNR is 6 dB or less for Binary Phase Shift Keying (BPSK) modulation;
   the SNR is 12 dB or less for Quadrature Phase Shift Keying (QPSK);
   the SNR is 18 dB or less for Quadrature Amplitude Modulation (QAM-16);
   the SNR is 24 dB or less for QAM-64; and
   the SNR is 30 dB or less for QAM-256.

5. The OFDM receiver of claim 1 where the tunable system clock output is 40.000 MHz in the first mode.

6. The OFDM receiver of claim 1 where the tunable system clock output is the particular OFDM subcarrier center frequency divided by 61 in the second mode.

7. The OFDM receiver of claim 1 where the tunable system clock is a crystal oscillator utilizing a quartz crystal with a variable tuning element coupled to the frequency offset input.

8. The OFDM receiver of claim 7 where the variable tuning element is a voltage controlled capacitor.

9. The OFDM receiver of claim 1 where the baseband processor comprises the FFT processor, a subcarrier nuller, a symbol decoder, and a demodulator.

10. The OFDM receiver of claim 1 where the RF amplifier is coupled to a baseband mixer, the baseband mixer coupled to a programmable RF PLL input which maintains a constant output frequency in the first mode and the second mode.

11. An Orthogonal Frequency Division Multiplexing (OFDM) receiver comprising:
   a Radio Frequency (RF)amplifier receiving wireless packets;
   a tunable system clock generator generating a system clock which is coupled to a programmable modem PLL generating a modem clock output;
   a baseband converter generating a stream of digitized baseband quadrature symbols and using the modem clock output;
   a baseband processor having a Fast Fourier Transform (FFT) processor coupled to the digitized baseband quadrature symbols and generating a plurality of outputs, each output of the plurality of outputs corresponding to an OFDM subcarrier, the baseband processor using a modem clock output;
   the tunable system clock generator having at least one harmonic frequency corresponding to a particular OFDM subcarrier frequency;
   a controller detecting a receive signal strength and modulation type, the controller asserting a first mode when a combination of the receive signal strength for a modulation type is above a threshold, and asserting a second mode when a combination of the receive signal strength for a modulation type is below a threshold;
   in the second mode, the controller output configured to change the tunable system clock generator frequency offset input to generate a harmonic of the tunable system clock generator frequency corresponding to the particular OFDM subcarrier frequency;
   the FFT nulling an output of the FFT corresponding to the at least one harmonic frequency;
   the programmable modem PLL maintaining the modem frequency constant in the first mode and the second mode.

12. The OFDM receiver of claim 11 where the threshold for the modulation type is at least one of:
   an SNR of 6 dB or less for Binary Phase Shift Keying (BPSK) modulation;
   an SNR of 12 dB or less for Quadrature Phase Shift Keying (QPSK) modulation;
   an SNR of 18 dB or less for Quadrature Amplitude Modulation (QAM-16) modulation;
   an SNR of 24 dB or less for QAM-64 modulation; and
   an SNR of 30 dB or less for QAM-256 modulation.

13. The OFDM receiver of claim 11 where the FFT nulling of an FFT output comprises a scaling in a range from 0 to 1.

14. The OFDM receiver of claim 11 where the threshold includes a hysteresis value of dB.

15. The OFDM receiver of claim 11 where the tunable system clock oscillator includes a crystal oscillator coupled to a variable capacitor whose capacitance is determined by the frequency offset input.

16. The OFDM receiver of claim 11 where the baseband processor receives signals mixed to baseband from a programmable RF PLL which is coupled to the tunable system clock oscillator, the output of the programmable RF PLL programmed to generate the same frequency in the first mode as in the second mode.

17. A method for reducing a clock spur influence on an OFDM subcarrier in an OFDM receiver, the method operative on:
   a tunable system clock generator generating a system clock which is coupled to a programmable modem PLL generating a modem clock output;
   a baseband converter generating a stream of digitized baseband quadrature symbols and using the modem clock output;
   a baseband processor having a Fast Fourier Transform (FFT) processor coupled to the digitized baseband quadrature symbols and generating a plurality of outputs, each output of the plurality of outputs corresponding to an OFDM subcarrier, the baseband processor using a modem clock output;
   a controller;
   the tunable system clock generator having at least one harmonic frequency corresponding to a particular OFDM subcarrier frequency;
   the method comprising:
   the controller detecting a receive signal strength and modulation type, the controller asserting a first mode when a combination of the receive signal strength for a modulation type is above a threshold, and asserting a second mode when a combination of the receive signal strength for a modulation type is below a threshold;
   the controller changing the tunable system clock generator frequency offset input to generate a harmonic of the tunable system clock generator frequency to correspond to the particular OFDM subcarrier frequency;
   nulling an output of the FFT corresponding to the at least one harmonic frequency;
   maintaining an output of the programmable modem PLL frequency constant in the first mode and the second mode.

18. The method of claim 17 where the FFT nulling is the application of a scaling constant from 0 to 1 to the FFT output corresponding to the particular OFDM subcarrier frequency.

19. The method of claim 17 where the nulling an output of the FFT corresponding to the at least one harmonic frequency is the application of a scaling constant of 0 to the FFT output corresponding to the particular OFDM subcarrier frequency.

20. The method of claim 17 where the threshold for the modulation type is at least one of:
- an SNR of 6 dB or less for Binary Phase Shift Keying (BPSK) modulation;
- an SNR of 12 dB or less for Quadrature Phase Shift Keying (QPSK) modulation;
- an SNR of 18 dB or less for Quadrature Amplitude Modulation (QAM-16) modulation;
- an SNR of 24 dB or less for QAM-64 modulation; and
- an SNR of 30 dB or less for QAM-256 modulation.

21. The method of claim 20 where the SNR of the threshold includes hysteresis for changing from the second mode to the first mode.

\* \* \* \* \*